United States Patent [19]

Schladitz

[11] 4,108,108

[45] Aug. 22, 1978

[54] APPARATUS FOR METALLIZING STRIPS, SHEETS OR THE LIKE

[75] Inventor: Hermann Johannes Schladitz, Munich, Fed. Rep. of Germany

[73] Assignee: Schladitz-Whiskers AG., Zug, Switzerland

[21] Appl. No.: 688,560

[22] Filed: May 21, 1976

Related U.S. Application Data

[63] Continuation of Ser. No. 486,956, Jul. 10, 1974, abandoned.

[51] Int. Cl.² .............................................. C23C 13/08
[52] U.S. Cl. .................................................... 118/49.1
[58] Field of Search ............................ 118/49.1, 49.5; 331/94.5 P; 219/349

[56] References Cited

U.S. PATENT DOCUMENTS

| 2,845,894 | 8/1958 | McIlvaine | 118/49.1 |
| 3,627,590 | 12/1968 | Mammel | 118/49.1 UX |
| 3,658,032 | 4/1972 | Kohler et al. | 118/48 |
| 3,776,181 | 12/1973 | Miller | 118/49.5 |

FOREIGN PATENT DOCUMENTS

| 752,400 | 6/1953 | Fed. Rep. of Germany | 219/349 |
| 938,499 | 2/1956 | Fed. Rep. of Germany | 219/349 |
| 938,699 | 10/1963 | United Kingdom | 118/49.5 |

Primary Examiner—Ronald Feldbaum
Attorney, Agent, or Firm—Oblon, Fisher, Spivak, McClelland & Maier

[57] ABSTRACT

Device for metallizing strip material along surface areas by decomposing a gaseous metallic compound within or close to a focal line extending within or close to the surface of the strip material and metallizing same by moving it in a transverse direction to the focal line.

6 Claims, 2 Drawing Figures

U.S. Patent  Aug. 22, 1978  4,108,108
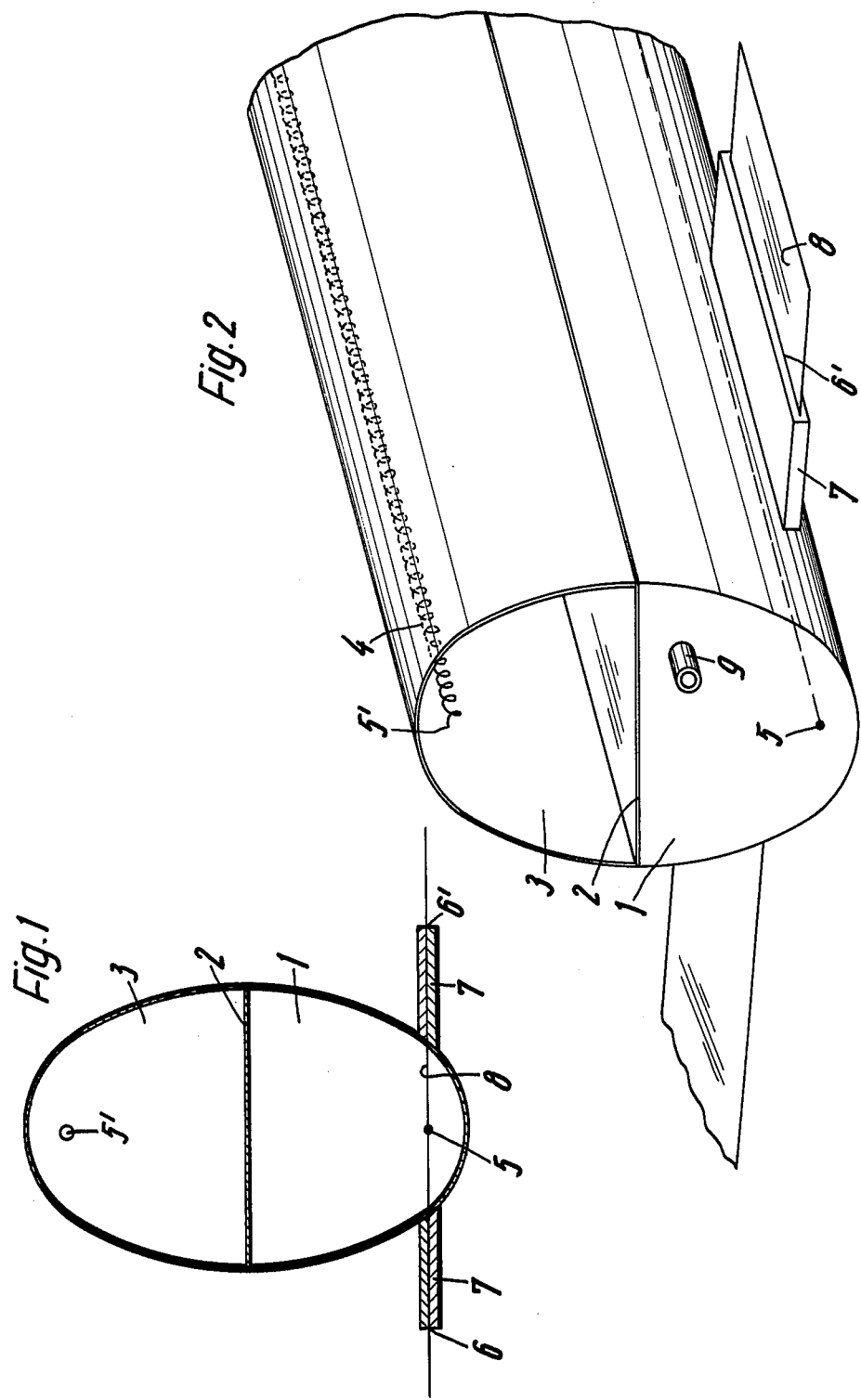

APPARATUS FOR METALLIZING STRIPS, SHEETS OR THE LIKE

This is a continuation of application Ser. No. 486,956, filed July 10, 1974, now abandoned.

The present invention relates to a process and an apparatus for metallizing strips, sheets or the like, particularly strip material continuously passing through a metallizing device by decomposing gaseous metallic compound.

Apparatuses of the afore-mentioned type are already known, showing the disadvantage that the quality and the thickness of the coating produced on strips, sheets or the like varies or differs substantially. As a consequence of depositing the metal on a large surface on account of thermal decomposition of the gaseous metallic compound an important irregularity is caused with regard to the quantity of the decomposed metal as well as to its crystalline structure, depending i.a. on the local conditions (rate of nucleus formation, irregularities or the like) at the surface to be metallized. Generally an undesired coarse-crystalline structure is generated which shows variations in the size of its crystals.

The technical art furthermore requires a considerable heating-up of the whole material, as the current gaseous metallic compound, for example, metal carbonyles, show relatively high decomposition temperatures, at which some of the materials, which are to be metallized, beome already plastic or suffer other undesirable changes as to their properties; furthermore, the amount of energy required for heating the material over the whole cross-section up to the decomposition temperature of the gaseous metallic compound is very high. Local differences during heating the material cause further irregularities as to temperature and amount of metal deposited in the different areas of the strip. If the strips, sheets or the like attain the decomposition-temperature only in a thin surface region, whilst the interior of the strip remains at a rather low temperature, the metallizing process may be interrupted on account of the endothermic reaction in those parts of the metallizing chamber which are being crossed after the surface temperature has been reduced below decomposition-temperature, because no heat can be delivered from the interior of the material.

Object of the present invention is to provide more reproducible and constant decomposition conditions for the metal coating and to avoid an extreme overheating of the passing material as well as special heating chambers.

The heretofore existing problems are solved by moving the surface to be metallized through at least one focal line of an optical system in transverse direction to the said focal line, the focal line of the surface area to be metallized extending either in this surface or parallel and close to this surface. The expression "close" means that the focal line is situated so close to the surface that the temperature created at the adjacent surface region is sufficient to effect the decomposing of the gaseous metallic compound.

The present invention provides furthermore an apparatus for carrying out the process. According to one preferred embodiment of the apparatus the metallizing chamber, in which at least one focal line, collecting heat radiation is arranged, provides opposite slotted holes in its walls, running parallel to each other and to the focal line. The slotted holes for leading the said passing material are preferably constructed like sluices. As it is already known, the metallizing chamber provides inlets and outlets for the gaseous metallic compound.

According to an especially advantageous embodiment of the invention the metallizing chamber has the shape of a tube cross-section closed at its ends. The lower part of the tube is separated from the upper part by an intermediate wall transparent to heat radiation. The walls of the tube show reflecting qualities, which can be improved by coating the walls for example with a thin silver layer. Lateral openings for the passing material limit the reflector-area of the tube walls. This, however, is not very important if the focal line is arranged close to the tube bottom.

The radiation source is preferably arranged in a chamber with an elliptical cross-section which has also the effect of a focal reflector having a reflecting interior surface. As a consequence of the metallizing chamber being closed as to the radiation source no condensation of the gaseous metallic compound can take place at the radiation source. The chamber, in which the radiation source is located, should not be closed at its ends as this could reduce the cooling effect as to the connections and the air surrounding the radiation source.

It goes without saying that more than one focal line may be also provided in the metallizing chamber. These focal lines must be arranged parallel to each other in a common plane defined by the plane of the passing material. In this case a plurality of metallizing zones are available.

Preferably the material to be metallized has a plane-like shape, if the focal line has a shape of a straight line. If strips, sheets or the like have a developable bent surface the focal line may be correspondingly provided as a curved line. As it is known already, this can be achieved by a corresponding construction of the optical system.

It is furthermore possible to effect a reciprocating motion transvers to the focal line if strips, sheets or the like have smaller sizes. In this case the coat is deposited during a number of cyclic motions, so that the thickness of the coating can be controlled by the number of the cyclic motions.

The present invention has the advantage that the heat is concentrated right at that point were the metal decomposition shall be effected. The fact that the focal line contacts the surface of the passing material causes exactly defined decomposition conditions along the focal line which are widely independent from the pre-treatment of the passing material. The inner temperature of the metallizing chamber may remain relatively low so that no injurious decomposition of the metal, for example, at other points of the chamber may arise. The heating of the whole cross-section of the material becomes completely superfluous as the necessary heat to attain decomposition-temperature is achieved, at a well defined surface region. A short overheating in the decomposition region is generally not injurious if the passing velocity of the material is high enough. The possibility to apply relative high temperatures near the decomposition line improves the decomposition conditions and results in depositing relatively small crystalits adhering very well on the surface of the passing material.

Apparatuses for metallizing of passing mineral fibers providing an optical system with two focal lines, are already known. In this case the filament of the fibrous material is arranged in the one, the linear radiation source in the other focal line. This well-known arrangement, however, was not intended for the metallizing of wide surface areas of materials nor could an optical system with linear focal lines be considered suitable for metallizing surface areas or flat materials.

The present invention is described in detail by way of an example in the attached drawing:

FIG. 1 shows a sectional view of the inventive apparatus perpendicular to the focal lines of the system;

FIG. 2 shows a perspective side view of the apparatuse according to FIG. 1.

The metallizing chamber 1 consists of an elliptical tube being closed on its upper side by means of a cover 2 which is transparent for heat radiation. A teflon cover 2 is connected with the tube 1 by means of an adhesive or by welding. Above the metallizing chamber 1 an open elliptical metallic tube section 3 is arranged providing within the focal line 5' a radiation source, which may for example consist of an electrically heated spiral wire 4. Slot-shaped openings 6 are provided laterally and parallely to the focal line 5 of the metallizing chamber 1 allowing the passing of strips, sheets or the like. In this case the slotted holes 6 are connected with 7, shown schematically. These sluices serve to minimize the losses of the gaseous metallic compound. During the passing of the material through the slotted holes 6 and 6' metallizing of the surface 8 of the material is effected. The admission of metallizing gases is effected by means of a stud-like inlet 9, which is arranged at the side wall of the chamber 1.

What I claim is:

1. An apparatus for metallizing sheet material by thermal decomposition of a gaseous metallic compound comprising:
    a metallizing chamber,
    inlet means coupled to said chamber for permitting said gaseous metallic compound to be supplied to said chamber;
    means coupled to said chamber for enabling said sheet material to be continuously passed through said chamber while maintaining a gaseous atmosphere of said metallic compound adjacent said sheet material inside said chamber; and
    optical means about said metallizing chamber for generating a narrow, elongated high temperature zone adjacent one surface of said material, said high temperature being sufficient to cause thermal decomposition of said compound and metallization of said material, and said zone being sufficiently localized to confine heating of said material to said one surface.

2. An apparatus as in claim 1, wherein said optical means comprises:
    an optical system defining first and second focal lines,
    a radiation source extending along said first focal line,
    said second focal line located adjacent the surface of said material and providing an image of said radiation source for producing said high temperature zone.

3. An apparatus as in claim 2, wherein said optical system further comprises:
    an elongated reflection tube of elliptical cross-sectional configuration; and,
    transparent wall means dividing said reflection tube into two sections, each section containing only one of said focal lines.

4. An apparatus as in claim 3, wherein:
    said focal lines are curved.

5. An apparatus as in claim 3, wherein:
    said reflection tube is coated on its inner surface with a highly reflecting layer.

6. An apparatus as in claim 3, wherein:
    said radiation source is contained in one of said two sections of said reflection tube and said inlet means is coupled to the other of said two sections of said reflection tube.

* * * * *